(12) United States Patent
Qi et al.

(10) Patent No.: US 6,819,141 B1
(45) Date of Patent: Nov. 16, 2004

(54) HIGH SPEED, STATIC DIGITAL MULTIPLEXER

(75) Inventors: Jieming Qi, Austin, TX (US); Hung Cai Ngo, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/524,901

(22) Filed: Mar. 14, 2000

(51) Int. Cl.[7] .......................................... H03K 19/094
(52) U.S. Cl. ...................... 326/119; 326/113; 327/410
(58) Field of Search ................................ 326/106, 113, 326/119; 327/407, 408, 409, 410

(56) References Cited

U.S. PATENT DOCUMENTS 5,698,992 A  * 12/1997  El Ayat et al. ................. 326/41
6,124,736 A  *  9/2000  Yamashita et al. ........... 326/113

OTHER PUBLICATIONS

IBM Technical Disclosure Bulletin, "Differential Emitter Dotted Multiplexor", Feb. 1, 1994, TDB–ACC–NO: NA9402177, pp. 177–178.*

* cited by examiner

Primary Examiner—Daniel D. Chang
(74) Attorney, Agent, or Firm—Casimer K. Salys; Dillon & Yudell LLP

(57) ABSTRACT

A high speed static multiplexer comprising: (1) a plurality of data inputs and at least one select input; (2) an output; (3) a high voltage rail and a low voltage rail; (4) a pull-up circuit coupled between the output and the high voltage rail and further coupled to receive the data inputs and the select input so that the pull-up circuit generates a first logic state at the output in response to the selected data input having that first logic state; (5) and a pull-down circuit coupled between the output and the low voltage rail and further coupled to receive the data inputs and the select input, so that the pull-down circuit generates a second logic state at the output in response to the selected data input having that second logic state.

21 Claims, 3 Drawing Sheets

HIGH SPEED, STATIC DIGITAL MULTIPLEXER

BACKGROUND OF THE INVENTION

1. Technical Field

The present invention relates in general to digital circuits and in particular to a digital multiplexer. Still more particularly, the present invention relates to an improved design of a static digital multiplexer.

2. Description of the Related Art

A multiplexer (MUX) is an electronic device, which is capable of accepting more than one input signal simultaneously and chooses one (or more) of the input signals as an output signal in response to the state of one or more select input. Conventional multiplexers are typically designed utilizing a combination of transistors from within the family of metal-oxide-semiconductor field-effect transistor (MOSFETs). Traditional static complementary MOS (CMOS) multiplexers have larger overall surface area and are typically relatively slow. Currently, the more common MUX designs being utilized include static pass gate and transmission gate multiplexers. Both of these MUXes have found extensive use in microprocessor designs due to their high density and relatively low power performance. They also provide higher speed than traditional static complementary MOS (CMOS) multiplexers.

A three input, static pass gate multiplexer (PG-MUX) is depicted in FIG. 1. PG-MUX 100 is usually built with N-type MOSFETs (NFETS) 101 because they have larger current driving capability than PFETs. Each input 109 of PG-MUX 100 is coupled to an inline inverter 111, whose output is coupled to the drain of NFET 101. A corresponding select signal 113 is connected to the gate of NFET 101. The source of each NFET 101 is coupled to a muxnode 108. Muxnode 108 is coupled to the drain of PFET 107 and to a second inverter 103 in turn coupled to output 115. NFET 101 in PG-MUX 100 is a passive device; therefore, second inverter 103 is interposed between muxnode 108 and output 115 to yield sufficient current driving capability for output 115.

In operation, the total delay of PG-MUX 100 is the sum of the delays of an input inverter 111, a pass transistor (NFET 101), and second inverter 103. As is well known in the art, PG-MUX 100 is effective for passing a high input signal (i.e., a "1").

One major big drawback with a PG-MUX is that it cannot effectively and/or quickly pass a logic low input signal (i.e., a "0"). This is because the voltage at muxnode 108 is not the full power supply voltage, $V_{DD}$, of PFET 107 but rather is reduced by the value of the threshold voltage ($V_t$) of PFET 107 (i.e., $V_{DD}-V_t$). In order to pass a good logic "1" (i.e., inverted input "0"), a "half-latch" 105 is utilized to pull-up PFET 107 to $V_{DD}$. A typical half-latch 105 is implemented with PFET 107 whose gate is coupled in a feedback loop around second inverter 103. Utilization of half-latch 105 when passing a "1" followed by a "0" results in a significant switching penalty. By enabling a faster pass of a "1" with half-latch 105 a subsequent pass of a "0" is slowed down. This switching delay between "1" and "0" occurs because half-latch 105 continues to charge muxnode 108 until muxnode 108 is discharged to "0" and produces a "1" via inverter 103 to disable PFET 107. Therefore, a significant time is taken for the next input signal "1" to pass through as the half-latch 105 attempts to keep up the power at muxnode 108 after passing a logic "1" (i.e., inverted input signal 0), while the input is attempting to keep the power down. This "fight" causes additional current to be drawn, which leads to extra power dissipation and slower overall speeds.

A conventional three-input transmission gate multiplexer (TG-MUX) is illustrated in FIG. 2. Each input 209 of TG-MUX 200 is connected to inline inverter 211, whose output is coupled to the drain of NFET 201 and source of PFET 207. NFET 201 and PFET 207 are connected in parallel, source to drain. A corresponding select signal 213 is connected to the gate of NFET 201, while the complement of select signal 206 is connected to the gate of PFET 207. Complement of select signal 206 is generated by passing select signal 213 through second inverter 204. The outputs of the parallel branches of NFET 201 and PFET 207 are coupled together at muxnode 208. Muxnode 208 is connected to third inverter 203, which inverts the signal to produce output 115. Unlike a PG-MUX, TG-MUX 200 does not utilize a half-latch to pass a good "0" or good "1". However, TG-MUX 200 is not necessarily faster than a PG-MUX, because TG-MUX uses additional parallel PFET 207, which is weaker than NFETs and adds extra delays due to a larger capacitance. In the design of TG-MUX 200, select signal 213 and its complement signal 206 have to be applied, and thus extra circuitry (i.e., second inverter 204) is required to generate complement signals 206. Utilizing extra circuitry 204 prevents select signal 213 and complement signal 206 from arriving at the same time due to the delays associated with second inverter 204. The "under-lapping" of select signal 213 and complement signal 206 leads to longer "open" time of the gates of the transistors 201 and 207 respectively, which leads to cross DC currents through the input data paths. Such currents in turn result in speed degradation and extra power dissipation.

Improving the operation of the conventional designs of multiplexers has proven to be difficult. In particular, no major improvement in speed and low power applications has occurred recently.

The present invention recognizes that it would be desirable and beneficial to have a multiplexer circuit with improved speed performance over the traditional MUX circuits. It would further be desirable to provide a multiplexer circuit which operates with low power dissipation. A MUX design which incorporates both improved speed and power dissipation, while overcoming the afore-mentioned problems associated with traditional MUX designs would be a welcomed improvement. These and other benefits are provided by the invention described herein.

SUMMARY OF THE INVENTION

A high speed static multiplexer is disclosed comprising: (1) a plurality of data inputs and at least one select input; (2) an output; (3) a high voltage rail and a low voltage rail; (4) a pull-up circuit coupled between the output and the high voltage rail and further coupled to receive the data inputs and the select input so that the pull-up circuit generates a first logic state at the output in response to the selected data input having that first logic state; (5) and a pull-down circuit coupled between the output and the low voltage rail and further coupled to receive the data inputs and the select input, so that the pull-down circuit generates a second logic state at the output in response to the selected data input having that second logic state.

In a preferred embodiment, three N-type transistors are utilized in each of at least two sets of transistors corresponding to each data input. The data input is coupled to an inverter, which inverts the input data. The output of the inverter is coupled to the drain of the first transistor and to the gate of the third transistor. The pull-down circuit includes the second and third transistors, which are connected in series and enable a fast pull-down of the output during selection of a low input data. The select input circuit is coupled to the gate of the first transistor and the gate of the second transistor. The pull up circuit includes a P-type transistor, with its gate connected to the source of the first transistor. The output is coupled to the drain of the second transistor and is also operatively coupled to the drain of the P-type transistor. Operation of the P-type transistor allows selection of the output to occur with lower dissipation.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

This invention provides a new design of a static multiplexer, referred to herein as the high-speed, static multiplexer (HSS-MUX), which substantially reduces or eliminates the problems inherent with conventional pass gate and transmission gate multiplexers. For example, HSS-MUX eliminates the fight condition in the PG-MUX described previously. The HSS-MUX of the present invention demonstrates higher speed performance and operates with low-power dissipation.

Figure 1:
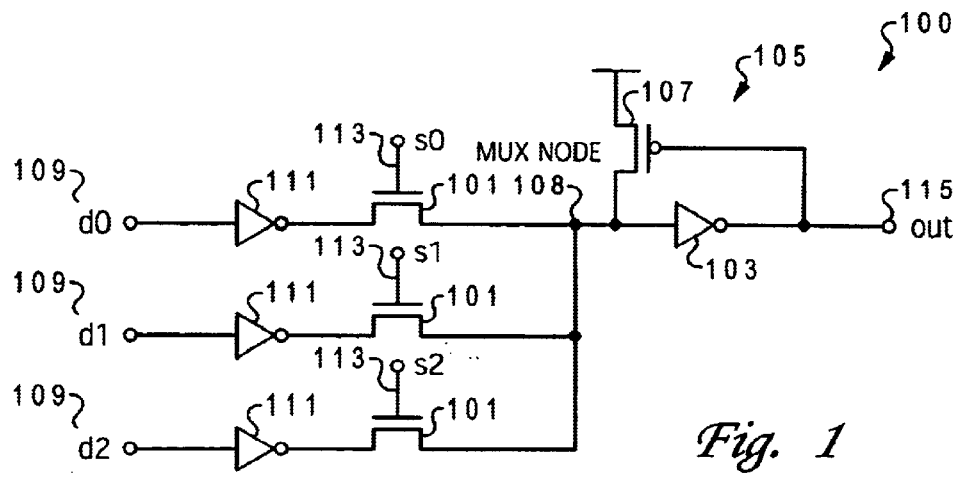
FIG. 1 is a block diagram of a prior art, three-input, pass gate multiplexer.
Figure 2:
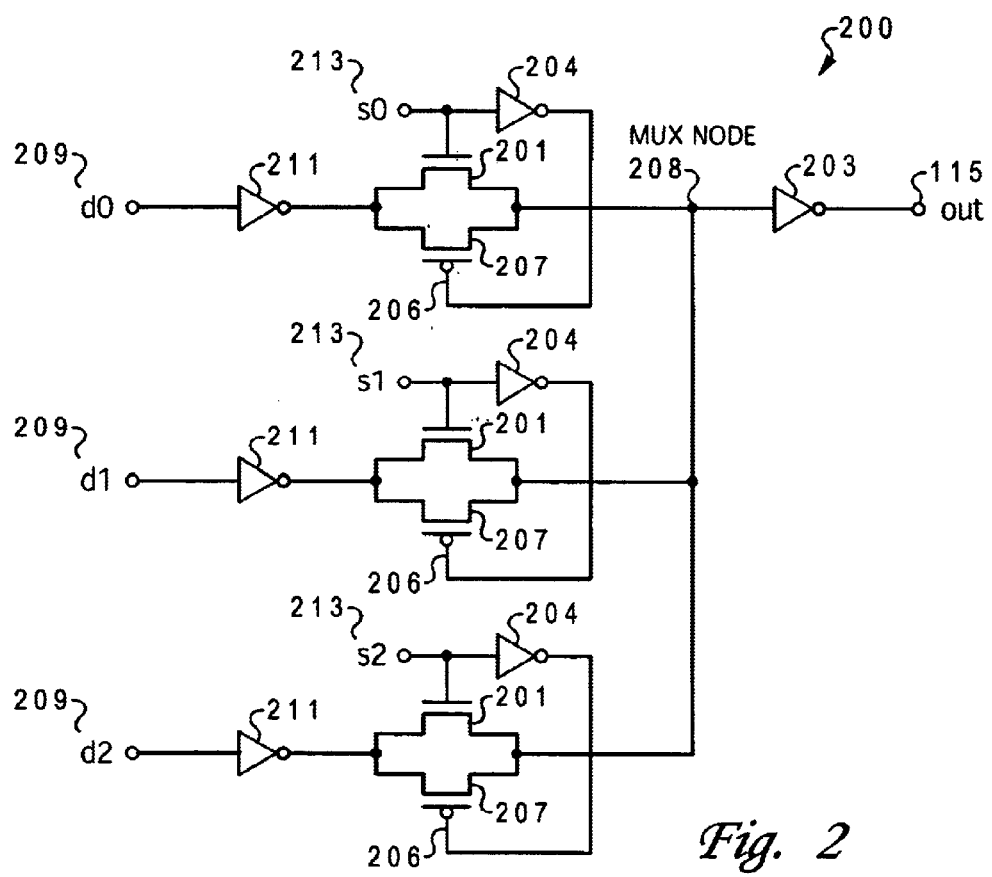
FIG. 2 is a block diagram of a prior art, three-input, transmission gate multiplexer.
Figure 3:
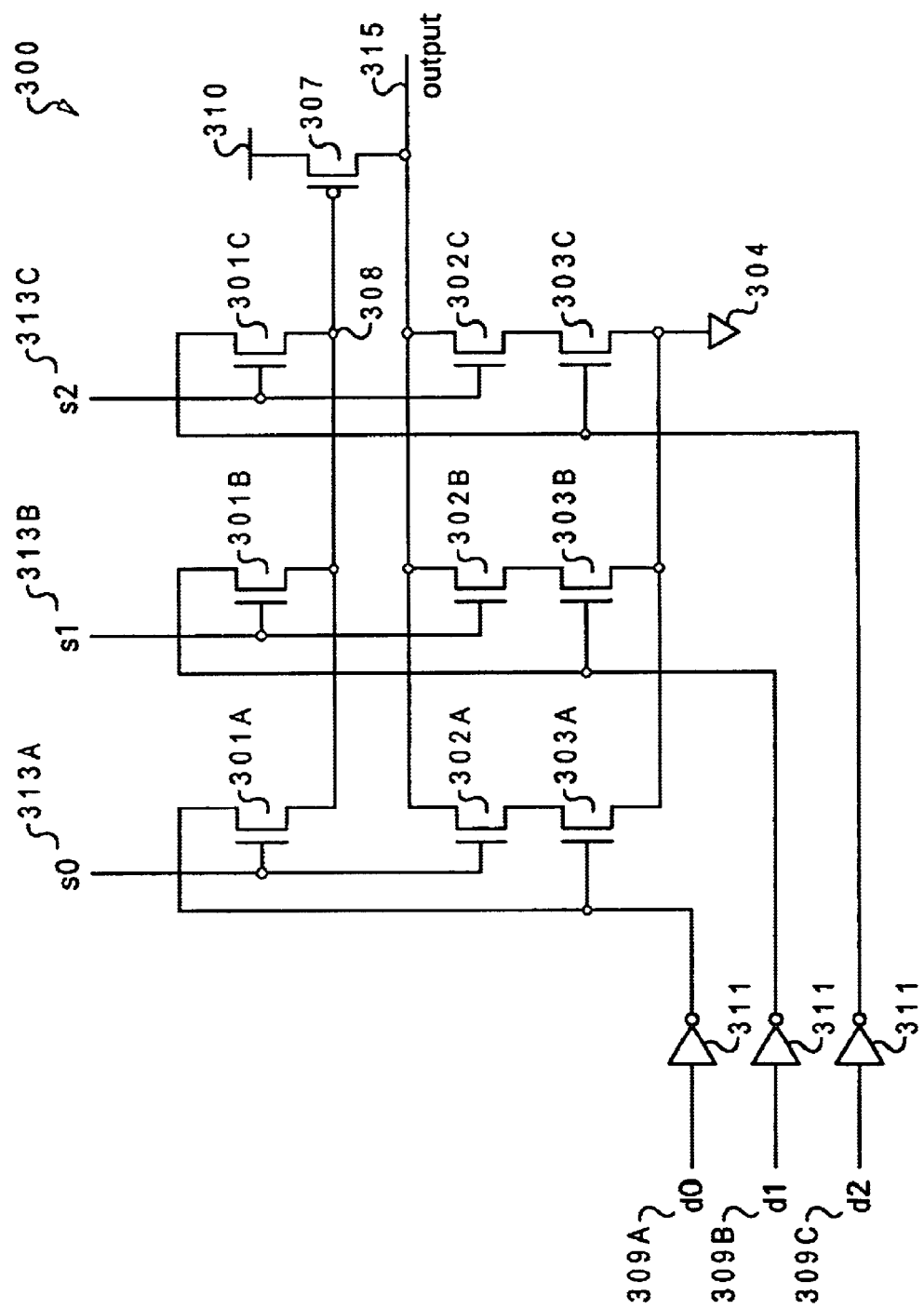
FIG. 3 is a block diagram of a three-input, high speed, static multiplexer according to one preferred embodiment of the present invention.

FIG. 3 illustrates a three-input implementation of a preferred embodiment of the HSS-MUX of the present invention. HSS-MUX 300 includes one set of NFETs for each data input 309A–309C. Each set of NFETs includes three NFETS, first NFETs 301A–301C, second NFETs 302A–302C, and third NFETs 303A–303C. Each data input 309A–309C of HSS-MUX 300 is coupled to a respective in-line inverter 311, which is in turn coupled to the drain of a respective one of first NFETs 301A–301C and to the gate of a respective one of third NFETs 303A–303C. Corresponding select signals 313A–313C are connected to the gate of first NFETs 301A–301C and to the gate of second NFETs 302A–302C. Second NFETs 302A–302C and third NFETs 303A–303C are coupled source-to-drain (i.e., connected in series). The source of third NFET 303A–303C is connected to ground 304.

The sources of first NFETs 301A–301C are coupled together at muxnode 308. Muxnode 308 is coupled to the gate of PFET 307, and the source of PFET 307 is connected to power supply voltage ($V_{DD}$) 310. The drains of second NFETs 302A–302C are coupled together with the drain of PFET 307 at output 315 of HSS-MUX 300.

Data input may be either high or low (i.e., a logic 1 or 0). Select signal 8 may be on (1) or off (0). The efficient operation of HSS-MUX 300 requires that select signals 313A—313C are orthogonal, i.e., only one select signal may be "on" at any time. This constraint is the same for a pass gate or transmission gate multiplexer. Those skilled in the art will appreciate that an overlapping of "1"s with select signals may lead to longer delay and greater power dissipation. Also, an under-lapping of "1"s with select signals can cause temporary floating state at muxnode 308 and the output 315. Therefore, in one embodiment, full latch structures are incorporated at the possible floating nets to improve noise tolerance.

A. Selected Input is Logic High

In operation, when input 309A receives a logic high input (1) and select signal 313A is on, the value of input 309A is inverted (1 to 0) by inverter 311. Select signal 313 turns on first NFET 301A and second NFET 302A. Inverted input (0) is received at the gate of third NFET 303A and turns off third NFET 303A. Inverted input also is sent to the drain of first NFET 301A and passes a "0" to muxnode 308 and ultimately to gate of PFET 307, which turns on. Shutting off third NFET 303A effectively shuts off second NFET 302A, which is connected in series, as current flow to ground 304 is inhibited. Output 315 is high "1".

Thus, output 315 is pulled up with PFET 307, which is fed a good "0" by the muxnode 308 when a selected data input is "1". Under this condition, second and third NFETs 302A and 303A are disabled and there is no steady state current flowing through them.

B. Selected Input is Logic Low

If, input 309A is receives a logic low input (0) and select signal 313 is on, the value of input 309A is inverted (0 to 1) by inverter 311. Select signal 313 turns off first NFET 301A and second NFET 302A. Inverted input (1) is received at the gate of third NFET 303A and turns on third NFET 303A. Inverted input also is sent to the drain of first NFET 301A, which passes a "1" to muxnode 308 and ultimately to gate of PFET 307, which turns off. Output 315 is directly pulled down to low (0) by second and third NFETs 302A and 303A as current flows to ground 304. This pull-down of output 315 leads to a faster operation.

During operation of HSS-MUX 300, second and third NFET 302A and 303A are utilized to pull down the output to logic low when a particular one of data inputs 309A–309C is low and a corresponding one of select signals 313A–313C is on. This feature leads to a faster pull-down characteristics of HSS-MUX 300 compared to the conventional PG-MUX and/or TG-MUX. In a conventional PG-MUX or TG-MUX, more effort is required to produce a "0" at the output from a data input value of "1." First, the muxnode needs to be charged high, which is a slow process. Second, the "1" at the muxnode is inverted by the following inverter to produce a "0" at the output, resulting in additional time loss.

Another advantage which is recognized with HSS-MUX 300 is its low power dissipation. PFET 307, can be turned off by a weak "1" and thus requires a relatively low voltage swing for switching. The signal swing at muxnode 308 ranges between zero and the difference between the drain voltage and the threshold voltage ($V_{DD}-V_t$) of PFET 307. This reduced signal swing, causes muxnode 308 to be pulled down to "low" faster than with a full signal swing (i.e., zero to $V_{DD}$). Thus, overall power dissipation is reduced. Unlike a PG-MUX, no half-latch is required to pull-up muxnode 308 to full V$_{DD}$ 310. Additionally, different from a conventional PG-MUX or TG-MUX, muxnode 308 of HSS-MUX 300 is coupled to the gate of PFET 307 rather than an output inverter. The load at muxnode 308 is thus substantially reduced and overall speed of HSS-MUX 300 is improved.

According to the embodiment of FIG. 3, the orthogonal select signals 313 are applied to first NFETs 301A–301C and second NFETS 302A–302C. This allows second and third NFETs 302A–302C and 303A–303C to be isolated and enable better speed and noise tolerance. In one preferred embodiment, each pair of second and third NFETs 302A–303A, 302B–303B, 302C–303C may be tapered (i.e., second NFETs 302A–302C are made with smaller transistors than third NFETs 303A–303C). The capacitance seen at the output node is that of second NFET 302A–302C, and therefore the output node capacitance is reduced, resulting in a higher speed.

HSS-MUX 300 is capable of directly driving other static logic or some other load through the PFET pull-up device and second and third NFET pull-down functionality. For example, HSS-MUX can directly feed an inverter, a NAND gate, a NOR gate, or another multiplexer.

Figure 4:
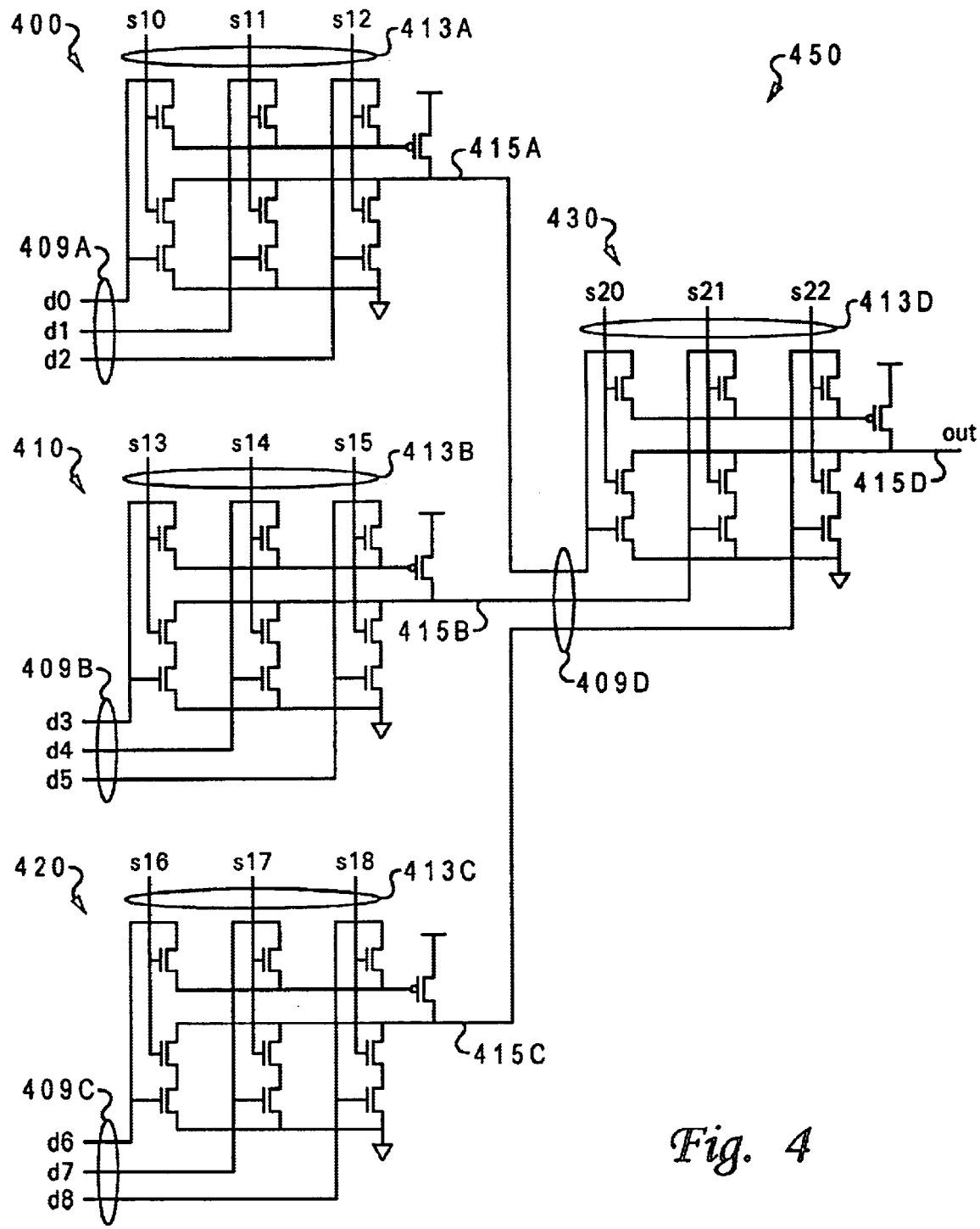
FIG. 4 is a block diagram of a bi-level, nine-input, high speed static multiplexer according to another preferred embodiment of the present invention.

FIG. 4 illustrates a bi-level nine-input HSS-MUX is according to another preferred design of the present invention. Two levels of HSS-MUXes are illustrated with the first level comprising of 3-three input HSS-MUXes 400, 410, 420. The outputs 415A–415C of MUXes 400, 410 and 420 at the first level are coupled to the inputs 409D of second level MUX 430. This configuration utilizes several single HSS-MUXes to create an expandable multi-way MUX 450. Unlike HSS-MUX 300 of FIG. 3, HSS-MUXes utilized to create expandable multi-way MUX 450 do not include an inverter coupled to the inputs 409A–409D. No inverter is required since the outputs 415A–415C at the first level, which are inverted, are in turn inverted at the second level to yield the corrected output 415D. Each HSS-MUX thus produces an output 415A–415D, which is inverted compared to the corresponding selected data input among data inputs 409A–409D Thus, a number of N-input HSS-MUXes may be utilized to created a bi-level NxM-input multiplexer, where M is equal to or less than N. For example, by directly feeding the outputs of 8 eight-input HSS-MUXes to the data input of another 8 input HSS-MUX, a 64-input HSS-MUX may be constructed, which yields a positive logic output. The number of levels of MUXes may be further expanded to yield an even more complex design.

The MUX of the present invention was compared with a conventional pass gate and static gate multiplexers during a series of circuit simulations. Optimized 8-input multiplexers were utilized. Two different types of transistors within the MUXs were tested, bulk silicon and silicon on insulator (SOI). The simulations were performed using the same input drivers, same output loading to each MUX, and for both data-gated (i.e., the data arrived after the select signal) and select-signal gated (i.e., the select signal arrived after the data) conditions. All MUXs were individually optimized, and the worse case delay scenario analyzed. The simulation results are presented below in Table I. As explained below, the HSS-MUX of the present invention achieved substantial speed improvements over conventional pass gate and transmission gate multiplexers.

TABLE I

|  | 8S SOI select-gated | 8S SOI data-gated | 8S Bulk select-gated | 8S Bulk data-gated |
| --- | --- | --- | --- | --- |
| TG-MUX | 19% | 15% | 25% | 22% |
| PG-MUX | 8% | 8% | 18% | 19% |

The first test simulated CMOS SOI technology. As illustrated in Table I, the HSS-MUX demonstrated a worst case delay improvement of 19% and 8% over a transmission gate multiplexer and a pass gate multiplexer, respectively. The second test, which simulated CMOS bulk technology resulted in a worst case delay improvement by HSS-MUX over the conventional MUXes of 25% and 19%, respectively.

The HSS-MUX exhibits improved speed performance over the conventional multiplexer designs. HSS-MUX utilizes a PFET; however, no keeper function is required. Also, the HSS-MUX exhibits a small signal swing which results in significant power saving. Due to the low power feature, i.e., because the PFET shuts off for relative voltages, which is less than a full value of V$_{DD}$, HSS-MUX may save power over conventional MUXes.

While the invention has been particularly shown and described with reference to a preferred embodiment, it will be understood by those skilled in the art that various changes in form and detail may be made therein without departing from the spirit and scope of the invention. For example, although the invention has been described with specific reference to a MOSFET transistor technology, the invention is capable of being implemented utilizing other types of transistor technology, such as MESFETs. Transistors are thus presented in the claims with three nodes, a control node, a first data node and a second data node. In the preferred embodiment, control node refers to the gate of both N-type and P-type transistor, first data node refers to the drain of N-type transistor and the source of P-type transistors, and second data node refers to the source of N-type transistor and the drain of P-type transistors.

What is claimed is:

1. A high speed static multiplexer comprising:
   a plurality of data inputs and at least one select input;
   an output;
   a high voltage rail and a low voltage rail;
   a pull-up circuit coupled between said output and said high voltage rail and further coupled to said plurality of data inputs and said at least one select input, wherein said pull-up circuit generates a first logic state at said output in response to a selected data input having said first logic state, wherein said pull-up, circuit includes a first-type transistor and a plurality of second-type transistors each having a control node, and a first and second data node, wherein said second data node of each of said plurality of second-type transistors is coupled to the control node of said first-type transistor, said first data node of each of said plurality of second-type transistors is coupled to a respective one of said plurality of data inputs, and said control node of each of said plurality of second-tyte transistors is coupled to one of said at least one select input; and
   a pull-down circuit coupled between said output and said low voltage rail and further coupled to receive said plurality of data inputs and said at least one select input, wherein said pull-down circuit generates a second logic state at said output in response to a selected data input having said second logic state.

2. The high speed static multiplexer of claim 1, wherein:
said first-type transistor is a P-type transistor having a control node, and a first and second data node, coupled at said first data node to said output and at said second data node to said high voltage rail, wherein said P-type transistor exhibits signal swings less than said high voltage rail; and
said plurality of second-type transistors are N-type transistors.

3. The high speed static multiplexer of claim 1, wherein said pull-down circuit comprises:
a plurality of sets of second type transistors, wherein each set includes a first and second transistor coupled in series, and further wherein said second transistor is coupled at its second data node to said low voltage rail and at its control node to one of said plurality of data inputs, and wherein said first transistor is further coupled at its control node to one of said at least one select input and at its first data node to said first data node of said firs-type transistor.

4. The high speed static multiplexer of claim 1, wherein each of said plurality of inputs are coupled to a respective inverter.

5. The high speed static multiplexer of claim 1, wherein:
said plurality of data inputs and said at least one select input controls a plurality of sets of second-type transistors to select one of said data inputs to yield said output;
wherein each set of said second-type transistors includes a first, second and a third transistor and a respective one of said plurality of data inputs is coupled to a control node of said third transistor and to a first data node of said first transistor; and said at least one select input is coupled to a control node of said first transistor and to a control node of said second transistor.

6. A high-speed static multiplexer comprising:
a plurality of data inputs;
at least one select input, wherein each of said at least one select input receives a respective select signal, and when multiple different select inputs are provided said different select inputs are orthogonal with respect to each other;
an output; and
a plurality of transistors operationally coupled between said plurality of data inputs and said output, wherein said plurality of transistors include a first-type transistor and a plurality of sets of second-type transistors, specific ones of which are coupled to a respective one of said plurality of data inputs, wherein said plurality of transistors each have a control node and a first and second data node and wherein said plurality of data inputs and said at least one select input controls said plurality of sets of second-type transistors to select one of said data inputs to yield said output;
wherein each set of said second-type transistors includes a first, second and a third transistor and the respective one of said plurality of data inputs is coupled to a control node of said third transistor and to a first data node of said first transistor, and one of said at least one select input is coupled to a control node of said first transistor and to a control node of said second transistor.

7. The high speed static multiplexer of claim 6, wherein said first-type transistors is a P-type transistor and said second-type transistors are N-type transistors.

8. The high-speed static multiplexer of claim 7, wherein each of said plurality of data inputs includes an in-line inverter for inverting each respective data input to produce an inverted input.

9. The high speed static multiplexer of claim 7, wherein further:
a second data node of said first N-type transistor is connected to a control node of said P-type transistor;
a second data node of said P-type transistor is connected to a power supply (VDD); and
a first data node of said P-type transistor is connected to said output.

10. The high speed static multiplexer of claim 9, wherein further:
a second data node of said third N-type transistor is connected to ground;
a first data node of said third N-type transistor is coupled to a second data node of said second N-type transistor; and
a first data node of said second N-type transistor is coupled to said first data node of said P-type transistor at said output.

11. The high speed static multiplexer of claim 7, wherein said P-type transistor has an on state and off state and wherein a voltage differential at said control node to change between said on and off states is less than the voltage differential between a high voltage applied at a second data node of said P-type transistor and a low voltage applied at a second data node of said third N-type transistor.

12. The high speed static multiplexer of claim 7, wherein said plurality of transistors are field effect transistors (FETs).

13. The high speed static multiplexer of claim 12, wherein further:
a second data node of said first N-type transistor is connected to a control node of said P-type transistor,
a second data node of said P-type transistor is connected to a power supply (VDD);
a first data node of said P-type transistor is connected to said output,
a second data node of said third N-type transistor is connected to ground;
a first data node of said third N-type transistor is coupled to a second data node of said second N-type transistor; and
a first data node of said second N-type transistor is coupled to said first data node of said P-type transistor at said output.

14. A multi-level high-speed static multiplexer comprising:
a plurality of connected levels of high speed static multiplexers, wherein each of said high speed multiplexers comprises:
a plurality of data inputs and at least one select input;
an output;
a high voltage rail and a low voltage rail;
a pull-up circuit coupled between said output and said high voltage rail and further coupled to said plurality of data inputs and said at least one select input, wherein said pull-up circuit generates a first logic state at said output in response to a selected data input having said first logic state wherein further said pull-up circuit includes a first-type transistor and a plurality of second-type transistors, each having a control node, and a first and second data node, wherein said second data node of each of said plurality of second-type transistors is coupled to the control node of said first transistor, said first data node of each of said plurality of second-type transistors is coupled to a respective one of said plurality of data inputs, and said control node of each of said plurality of second-type transistors is coupled to one of said at least one select input; and a pull-down circuit coupled between said output and said low voltage rail and further coupled to said plurality of data inputs and said at least one select input, wherein said pull-down circuit generates a second logic state at said output in response to a selected data input having said second logic state; and wherein each of said outputs at a first level of said plurality of levels is coupled to one of said plurality of data inputs of said high speed static multiplexers at a next level of said plurality of levels, wherein a multiplicative-input multiplexer is realized having N×M possible outputs, where N is a number of data inputs at said first level and M is the number of data inputs at the next level.

15. The multi-level high speed static multiplexer circuit of claim 14, wherein each even number of levels yields a corrected output and each odd number of level yields an inverted output.

16. The multi-level high speed static multiplexer of claim 15, further comprising an inverter coupled to each of said data inputs at said first level when said number of levels is odd.

17. The multi-level high speed static multiplexer of claim 15, further comprising an inverter coupled to said output at said final level when said number of levels is odd.

18. The multi-level high speed static multiplexer of claim 14, wherein:

said first-type transistor is a P-type transistor having a control node, and a first and second data node, coupled at said first data node to said output and at said second data node to said high voltage rail, wherein said P-type transistor exhibits signal swings less than said high voltage rail; and said plurality of second-type transistors are N-type transistors.

19. The multi-level high speed static multiplexer of claim 14, wherein said pull-down circuit comprises:

a plurality of sets of N-type transistors, wherein each set includes a first and second transistor coupled in series, and further wherein said second transistor is coupled at its second data node to said low voltage rail and at its control node to one of said plurality of data inputs, and wherein said first transistor is further coupled at its control node to one of said at least one select input and at its first data node to said first data node of said first-type transistor.

20. The multi-level high speed static multiplexer of claim 14, wherein:

said plurality of data inputs and said at least one select input controls plurality of sets of second-type transistors to select one of said data inputs to yield said output;

wherein each set of said second-type transistors includes a first, second and a third transistor and a respective one of said plurality of data inputs is coupled to a control node of said third transistor and to a first data node of said first transistor; and said at least one select input is coupled to a control node of said first transistor and to a control node of said second transistor.

21. The multi-level high speed static multiplexer of claim 13, wherein said plurality of levels includes more than two levels with a final level having a single high speed static multiplexer, and wherein each of said outputs of a given level is fed into at least one input at a next level until said final level.

* * * * *

UNITED STATES PATENT AND TRADEMARK OFFICE
CERTIFICATE OF CORRECTION

PATENT NO. : 6,819,141 B1
DATED : November 16, 2004
INVENTOR(S) : Qi et al.

It is certified that error appears in the above-identified patent and that said Letters Patent is hereby corrected as shown below:

Column 3,
Line 12, delete "lower" and insert -- low --.

Column 6,
Line 51, delete the comma "," after the word "pull-up".
Line 53, insert a comma -- , -- after "sistors".

Column 7,
Line 12, delete "second type" and insert -- second-type --.
Line 20, delete "firs-type" and insert -- first-type --.

Signed and Sealed this

First Day of November, 2005

JON W. DUDAS
*Director of the United States Patent and Trademark Office*